(12) United States Patent
Murai et al.

(10) Patent No.: US 6,229,156 B1
(45) Date of Patent: *May 8, 2001

(54) INVERTED THIN FILM TRANSISTOR HAVING A TRAPEZOIDAL-SHAPED PROTECTIVE LAYER

(75) Inventors: Hiroyuki Murai; Ken Nakashima, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/854,135

(22) Filed: May 8, 1997

(30) Foreign Application Priority Data

Oct. 28, 1996 (JP) ...................................... 8-285492

(51) Int. Cl.[7] ........................... H01L 27/12; H01L 29/786
(52) U.S. Cl. .................. 257/57; 257/61; 438/158
(58) Field of Search .................. 257/52, 53, 57, 257/61, 66; 438/158, 159, 160, 163, 713, 724

(56) References Cited

U.S. PATENT DOCUMENTS

| | | | |
|---|---|---|---|
| 4,978,420 | * | 12/1990 | Bach ...................................... 438/724 |
| 5,300,446 | * | 4/1994 | Fujioka . |
| 5,348,897 | * | 9/1994 | Yen . |
| 5,385,854 | * | 1/1995 | Batra et al. . |
| 5,397,718 | * | 3/1995 | Furuta et al. . |
| 5,455,182 | * | 10/1995 | Nishimoto et al. . |
| 5,474,941 | * | 12/1995 | Mitani et al. . |
| 5,610,082 | * | 3/1997 | Oh . |
| 5,612,235 | * | 3/1997 | Wu et al. . |
| 5,627,089 | * | 5/1997 | Kim et al. . |
| 5,668,019 | | 9/1997 | Kobayashi et al. . |

FOREIGN PATENT DOCUMENTS

| | | |
|---|---|---|
| 59-191383 | 10/1984 | (JP) . |
| 6-151459 | 5/1994 | (JP) . |

OTHER PUBLICATIONS

The American Heritage Dictionary, Second College Edition, Boston: Houghton Mifflin Company, 1982, p. 484.*

* cited by examiner

Primary Examiner—Mary Wilczewski
(74) Attorney, Agent, or Firm—Oblon, Spivak, McClelland, Maier & Neustadt, P.C.

(57) ABSTRACT

A thin film transistor of the present invention is composed of a transparent insulating substrate, a gate electrode formed on the transparent insulating substrate, a gate insulating film formed on the transparent insulating substrate including the gate electrode, a semiconductor active layer formed corresponding to the gate electrode through the gate insulating film, a source region and a drain region formed adjacent to the semiconductor active layer, a protective layer formed on the semiconductor active layer and having the side face inclined with respect to the transparent insulating substrate surface, a source electrode and a drain electrode formed respectively on the source region and the drain region, a part of which is extended onto the protective layer.

10 Claims, 7 Drawing Sheets

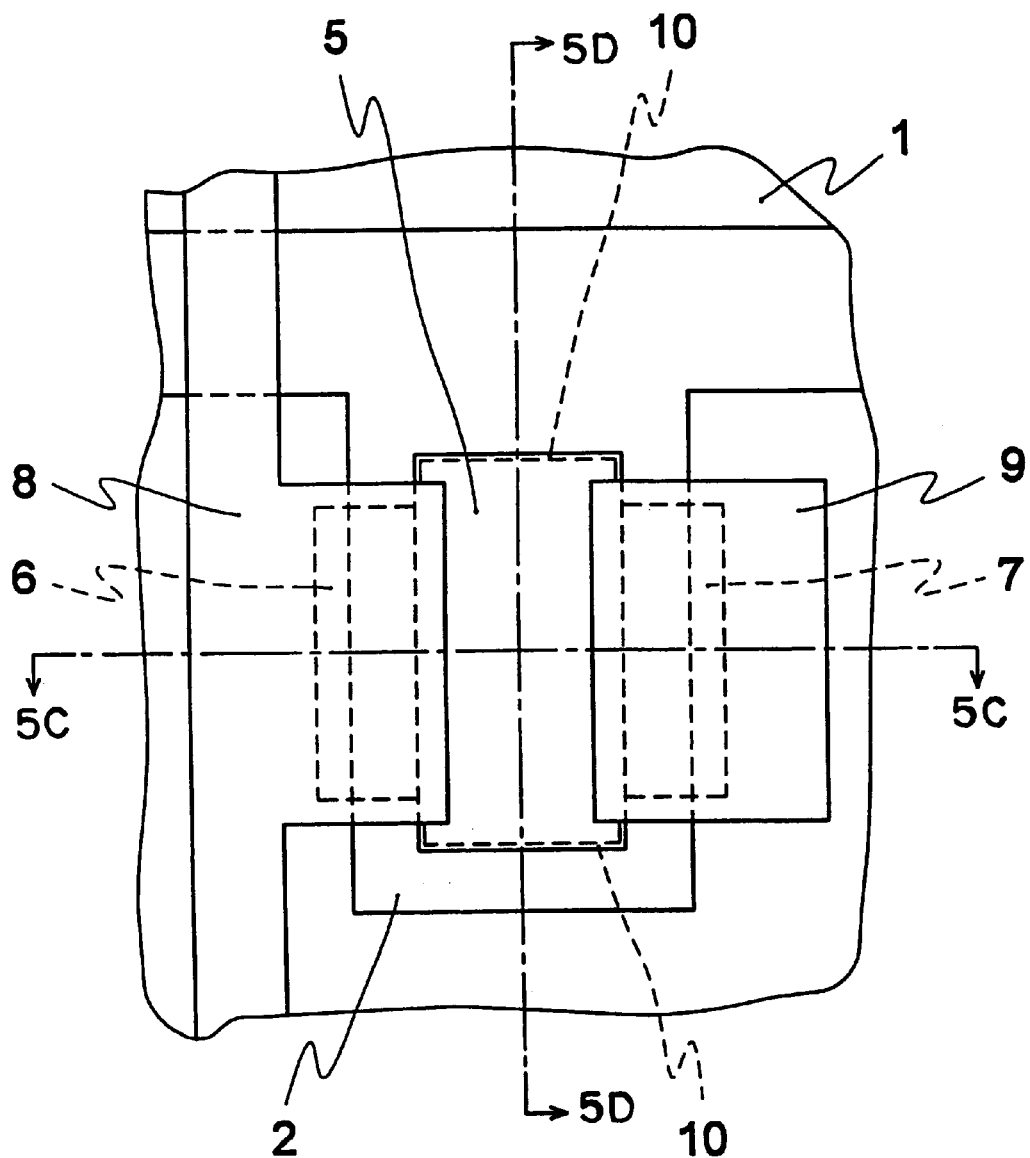

INVERTED THIN FILM TRANSISTOR HAVING A TRAPEZOIDAL-SHAPED PROTECTIVE LAYER

BACKGROUND OF THE INVENTION

The present invention relates generally to a thin film transistor to be used in matrix type liquid crystal display elements and the like, and a method of manufacturing the same.

FIGS. 5(a) to FIG. 5(d) are sectional views showing a method of manufacturing the conventional thin film transistors.

Referring now to FIG. 5, reference numeral 1 is a glass substrate as a transparent insulating substrate, reference numeral 2 is a gate electrode composed of, for example, Cr provided on the glass substrate 1, reference numeral 3 is a gate insulating film composed of silicon nitride (SiN) formed on the entire face of the glass substrate 1 including the gate electrode 2. Reference numeral 4 is an active layer composed of hydrogenated amorphous silicon (a-Si:H) formed on the gate insulating film 3 corresponding to the gate electrode 2, reference numeral 5 is a protective layer composed of silicon nitride formed on the active layer 4 and having approximately vertical sectional shape. Reference numerals 6 and 7 are source drain regions formed by doping into the hydrogenated amorphous silicon same as the active layer 4 and formed adjacent to both the sides of the active layer 4 by matching with the protective layer 5. Reference numerals 8 and 9 are source/drain electrodes composed of two layers Cr and Al, one portion of which is superposed on the protective film 5 and which is formed, on the source drain regions 6 and 7.

FIG. 6 is a plan view showing the conventional thin film transistor. FIG. 5(d) is a sectional view taken along a line A–A' of FIG. 6. Referring to the drawing, reference numerals 2 and 5 through 9 are the same as those of FIGS. 5(a) to (d). Reference numeral 10 is a chrome silicide formed on the end face of the patterned active layer 4.

FIGS. 7(a) and 7(b) are sectional views showing the conventional thin film transistor. FIG. 7(a) is a section view taken along B–B' of FIG. 6. In the drawing, reference numerals 1 through 5 are the same as those of FIGS. 5(a) to 5(d), reference 10 is the same as that of in FIG. 6. Reference numeral 11 is an etching-removed portion of the protective layer 5.

FIG. 8 is a graph illustrating the gate voltage-drain current characteristics of the thin film transistor and the normal thin film transistor with chrome silicide being formed.

A manufacturing procedure of the conventional thin film transistor will be described hereinafter in accordance with FIG. 5(a) through FIG. 5(d).

The gate electrode 2 is formed by depositing of Cr by a spattering method on the glass substrate 1 and etching of Cr with a given shape of resist as mask (FIG. 5(a)). A trapezoidal sectional shape is obtained with the use of ceric nitrate ammonium, and a mixed liquid of nitric acid and pure water as an etching liquid in the etching operation. After the resist has been removed, 370 nm of silicon nitride film, 100 nm of hydrogenated amorphous silicon film, and 200 nm of silicon nitride film are continuously deposited by a plasma CVD method. The 370 nm of silicon nitride film becomes a gate insulating film 3. Approximately vertical sectional shape of protective layer 5 is formed (FIG. 5(b)) by the plasma-etching using the mixed gas of (CHF$_3$ and He) after resist has been formed on the uppermost layer of silicon nitride film.

Then, after the resist has been removed, phosphorus is implanted into the entire face of the substrate to form n-type of hydrogenated amorphous silicon film. The active layer 4 which is the hydrogenated amorphous silicon of the non-dope is formed for self-matching operation into the pattern of the protective layer 5, when all the phosphorus ions have been implanted at 11 kV in acceleration voltage, because the phosphorus ion implanted onto the protective layer 5 stays within the protective layer 5. The other region becomes a hydrogenated amorphous silicon (FIG. 5(c)) doped into the n type. The n type of hydrogenated amorphous silicon is selectively plasma-etched with respect to the silicon nitride film by freon gas (F123) which is a product of E. I. dupon de Nemour & Co. and a mixed gas between SF$_6$ and O$_2$ with resist formed for pattern working the source drain regions 6 and 7, and the protective layer 5 as masks. Thereafter, to form the source drain electrodes, 100 nm of Cr and 300 nm of Al are continuously deposited by a spattering method.

First, the Al is etched with a mixed liquid of phosphoric acid, nitric acid, acetic acid, pure water with resist using in etching of the source drain regions 6 and 7 as masks and is washed sufficiently with the pure water. Then, the etching of Cr is effected with the mixed liquid of ammonium cerium nitrate, perchloric acid, pure water and thereafter the resist is removed. At this stage, the formation of the source drain electrodes 8 and 9 are completed and the conventional thin film transistor is completed.

The conventional thin film transistor and the method of manufacturing the thin film transistor had a problem in that chrome silicide 10 was formed on the end face of the active layer 4 patterned along the profile of the protective layer 5 as shown in FIG. 6, and the off current of such a thin film transistor became higher by few units than the off current (B of FIG. 8) of the normal thin film transistor as shown at A of FIG. 8.

Also, buffered fluorine was conventionally used to remove the chrome silicide 10 with a problem in that the source drain electrodes 8 and 9 were caused abnormal and the disconnection of the wiring was caused in the worst case, because the buffered fluorine was etched even in the Al which was the material of the source drain electrodes 8 and 9.

Also, there was also a method of plasma-etching the substrate entire face with the use of the mixed gas between CF$_4$ and O$_2$ as a method of removing the chrome silicide 10. However, the chrome silicide 10 could hardly be removed by the plasma-etching (FIG. 7(b)), because the chrome silicide 10 was formed beneath the protective layer 5 as shown in FIG. 7(a).

The present invention is provided to solve such problems as described above. A first object of the present invention is to remove a conductive layer which becomes a leakage current path between the source drain electrodes such as chrome silicide or the like to be formed on the end face of the active layer to obtain the thin film transistor which does not become high in the off current.

Also, a second object thereof is to provide a method of manufacturing such thin film transistor.

Further, a third object thereof is to provide a thin film transistor where the chrome silicide is hard to form in the end face of the active layer.

Also, a fourth object thereof is to provide a method of manufacturing such a thin film transistor.

SUMMARY OF THE INVENTION

Accordingly, the thin film transistor of the present invention comprises a transparent insulating substrate, a gate electrode formed on the transparent insulating substrate, a gate insulating film formed on the transparent insulating substrate including the gate electrode, a semiconductor active layer formed corresponding to the gate electrode through the gate insulating film, a source region and a drain region formed adjacent to the semiconductor active layer, a protective layer formed on the semiconductor active layer and having the side face inclined with respect to the transparent insulating substrate surface, a source electrode and a drain electrode formed respectively on the source region and the drain region, a part of which is extended onto the protective layer.

The semiconductor active layer is preferable to be an amorphous silicon layer.

The protective layer is preferable to be a silicon nitride film.

An inclined angle with respect to the transparent insulate substrate surface on the side of the protective layer is preferable to be 80 degrees or lower.

The source electrode and the drain electrode is preferable to have a chrome layer.

The source region and the drain region are preferable to have phosphorus doped as impurity.

The end face of the semiconductor active layer is preferable to have film oxide formed.

The end face which is not in contact with the source electrode and the drain electrode of the protective layer has a projection portions.

A method of manufacturing the thin film transistor of the present invention includes a first step of forming a gate electrode on the transparent insulating substrate, a second step of depositing a first insulating layer, a semiconductor layer, a second insulating layer sequentially on a transparent insulating substrate including on the gate electrode, a third step of forming a protective layer having the side face inclined with respect to the transparent insulating substrate surface by plasma-etching the second insulating layer, a fourth step of ion-implanting the impurities into the entire face of the transparent insulating substrate with the protective layer as mask, a fifth step of forming the source region and the drain region by etching the semiconductor layer, a sixth step of forming the source electrode and the drain electrode by depositing the metal layer on its entire face, and thereafter effecting an etching operation, a seventh step of plasma-etching the entire insulating substrate with the use of gas mixed with oxygen.

The second insulating layer is a silicon nitride layer, and the third step is preferable to plasma-etch the silicon nitride layer with the use of mixed gas including the sulfur fluoride and oxygen.

The semiconductor layer is preferable to be amorphous silicon layer.

The metal layer in the sixth step is preferable to be a chrome layer.

The gas to be used for the plasma-etching in the seventh step is preferable to have carbon fluoride mixed.

The eighth step of forming silicon film oxide on the end face of the amorphous silicon film with the use of the plasma including the oxygen gas is included. The eighth step is preferable to be performed, before the sixth step, after the completion of the fifth step.

The third step is preferable to adjust the inclined angle with respect to the transparent insulating substrate surface of the side face of the protective layer by change in the mixed ratio of the oxygen gas.

BRIEF DESCRIPTION OF DRAWINGS

FIG. 6 is a plan view showing a conventional thin film transistor.

DETAILED DESCRIPTION OF A PREFERRED EMBODIMENT

Embodiment 1

Figure 1A:
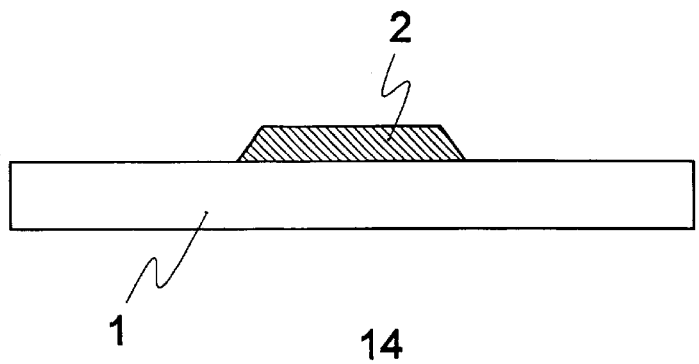
FIGS. 1(a) to 1(d) are each sectional view showing a method of manufacturing thin film transistor in accordance with Embodiment 1 of the invention.

The embodiments of the present invention will be described hereinafter.

FIG. 1 is a sectional view showing a method of manufacturing a thin film transistor in Embodiment 1 of the present invention. Referring now to the drawing, reference numerals 1 through 4 and 6 through 9 are the same as those of the above described conventional apparatus with the description thereof being omitted. FIG. 1 shows generally at 14 a protective layer composed of silicon nitride formed on an active layer 4, having a trapezoidal shape in section, which is tapered to 80 degree or lower in inclined angle of the side face with respect to the surface of the glass substrate 1. The source drain regions 6 and 7 are matched with the protective layer 14 and formed adjacent to both the sides of the active layer 4. Also, the source/drain electrodes 8 and 9 are formed with their portions being superposed on the protective layer 14.

Figure 7A:
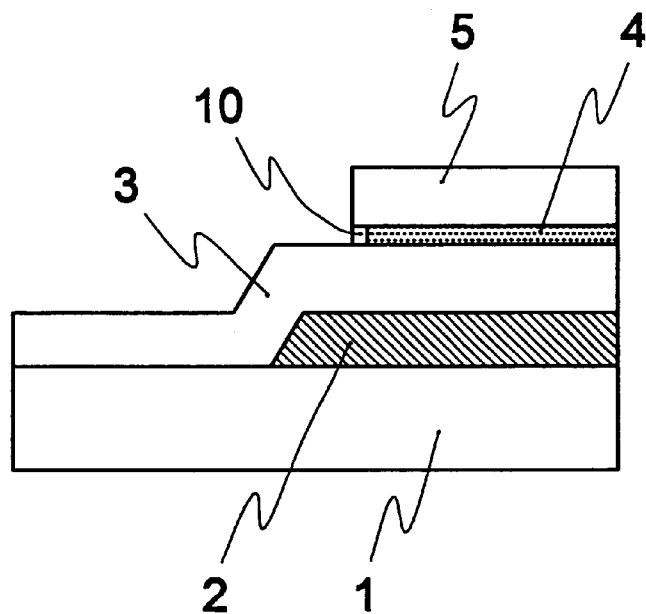
FIGS. 7(a) and 7(b) are each sectional view showing a conventional method of manufacturing thin film transistor.
Figure 7B:
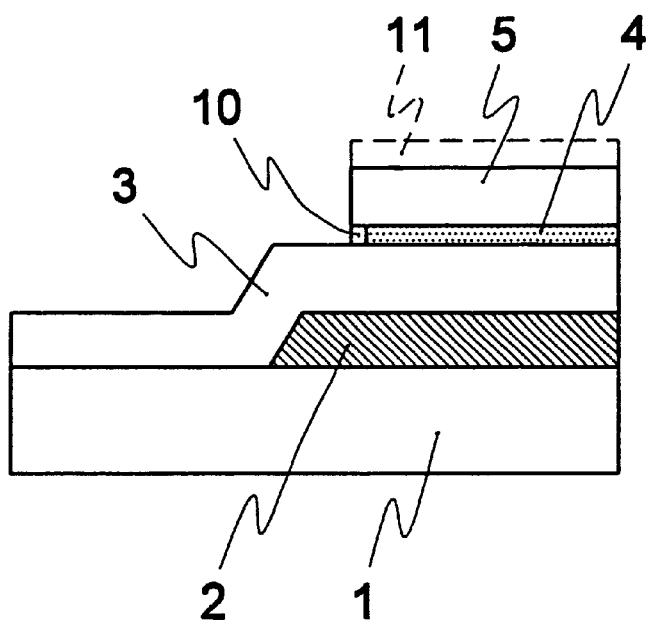

FIG. 2 is a sectional view showing a method of manufacturing a thin film transistor in Embodiment 1 of the present invention. Referring now to the drawing, reference numerals 1 through 4, 10 and 11 are the same as those of FIG. 7. Reference numeral 14 is the same as that of FIG. 1.

The procedure of manufacturing the thin film transistor of Embodiment 1 will be described hereinafter in accordance with FIG. 1(a) through FIG. 1(d).

First, the gate electrode 2 is formed (FIG. 1 (a)) by depositing of Cr by a spattering method on the glass substrate 1 and etching of Cr with a given shape of resist as mask. A trapezoidal sectional shape is obtained with the use of ammonium cerium nitrate, and a mixed liquid of nitric acid and pure water as an etching liquid in the etching operation. After the resist has been removed, 370 nm of silicon nitride film, 100 nm of hydrogenated amorphous silicon film, and 200 nm of silicon nitride film are continuously deposited by a plasma CVD method. The 370 nm of silicon nitride film becomes a gate insulating film 3.

Figure 1B:
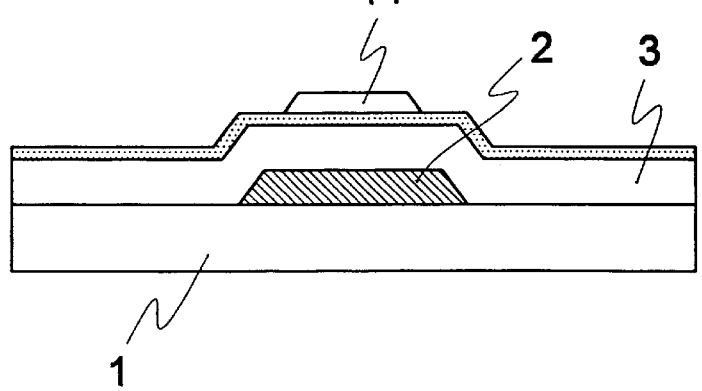

The protective layer 14 of a trapezoidal shape in section is formed (FIG. 1(b)) by the plasma-etching using the mixed gas of $SF_6$ and $O_2$ after resist has been formed on the uppermost layer of silicon nitride film. The angle of the taper can be made smaller by increase in the additional proportion of the $O_2$ in the plasma etching operation.

Figure 1C:
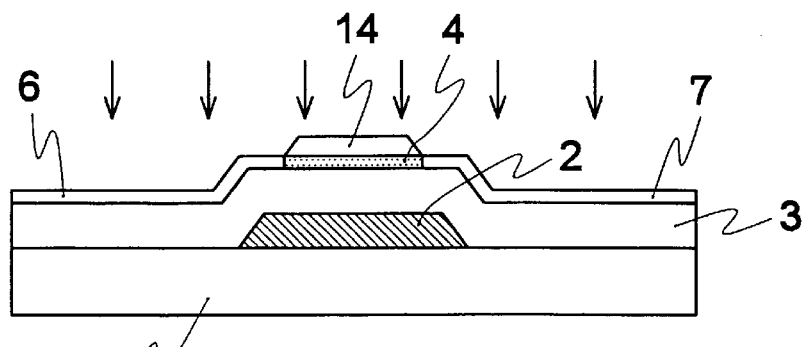
Figure 1D:
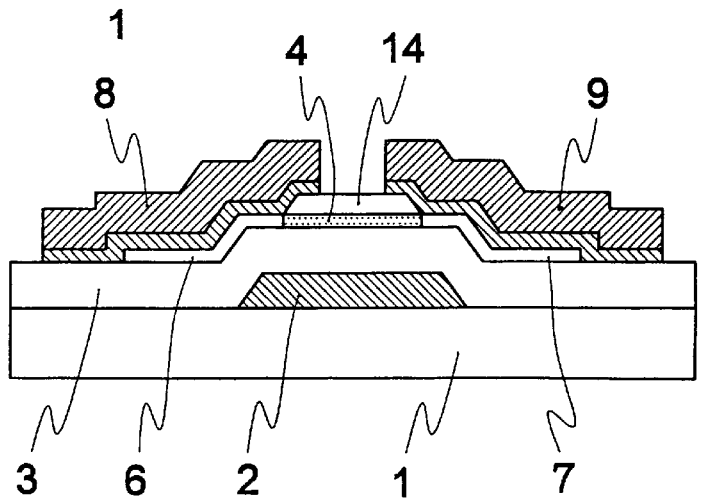

Then, after the resist has been removed, phosphorus is ion-implanted (FIG. 1(c)) into the entire face of the substrate to form the n-type of hydrogenated amorphous silicon film. The active layer 4 which is undoped hydrogenated amorphous silicon is formed for self-matching operation into the pattern of the protective layer 5, when the phosphorus ions have been implanted at 11 kV in acceleration voltage, because the phosphorus ions implanted onto the protective layer 14 stay within the entire protective film 14. The other region becomes a hydrogenated amorphous silicon doped into the n-type. The n-type of hydrogenated amorphous silicon is selectively plasma-etched with respect to the silicon nitride film by fregon (F123) which is a product of E. I. dupon de Nemour & Co. and the mixed gas between the $SF_6$ and the $O_2$ with resist formed for pattern working the source/drain regions 6 and 7 and the protective layer 14 as masks. Thereafter, to form the source/drain electrodes, 100 nm of Cr and 300 nm of Al are continuously deposited by a sputtering method. First, the Al is etched with the mixed liquid of phosphoric acid, nitric acid, acetic acid, pure water with resist as mask and is washed sufficiently with pure water. Then, the etching of Cr is effected with the mixed liquid of ammonium cerium nitrate, perchloric acid, pure water and thereafter the resist is removed. At this stage, the formation of the source drain electrodes 8 and 9 are completed and the outer shape of the conventional thin film transistor is completed (FIG. 1(d)).

Figure 2A:
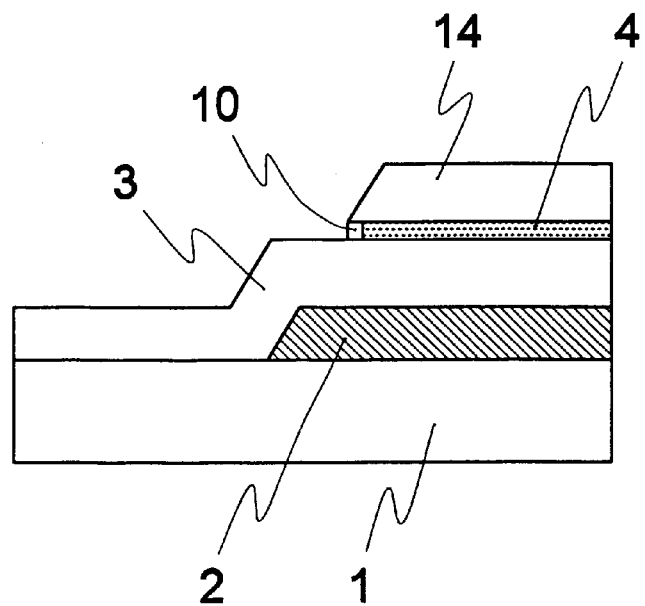
FIGS. 2(a) and 2(b) are each sectional view showing a method of manufacturing thin film transistor in accordance with Embodiment 1 of the invention.
Figure 8:
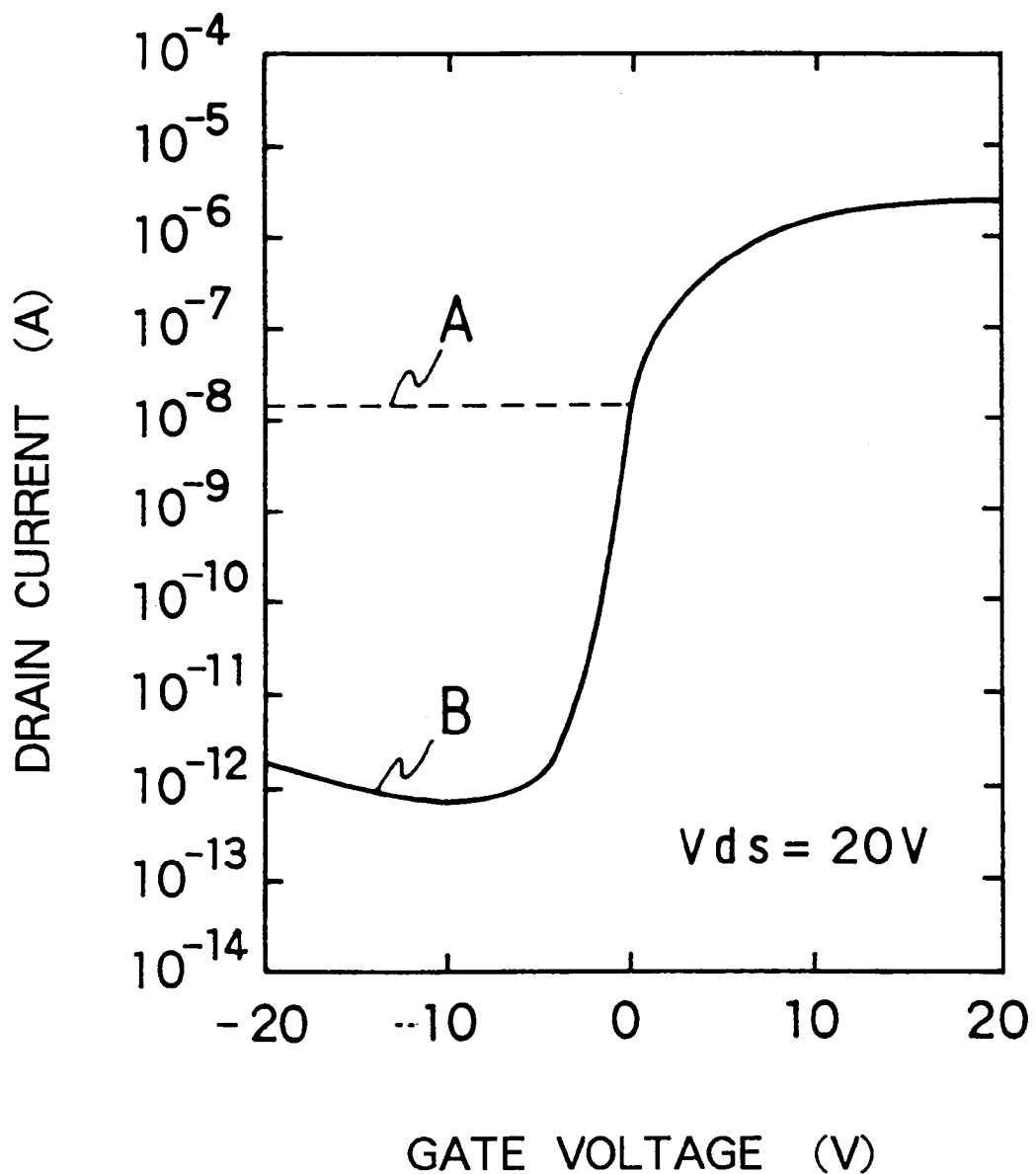
FIG. 8 is a graph illustrating the gate voltage-drain current characteristics of the thin film transistor and the normal thin film transistor with chrome silicide being formed.

However, in this condition, the chrome silicide 10 is formed (FIG. 2(a)) on the end face of the active layer 4 patterned along the pattern profile of the protective layer 14 as in the conventional thin film transistor, and the off current of the thin film transistor at this stage is higher by few units than the normal off current as shown at A in FIG. 8.

The substrate entire face is plasma-etched with the mixed gas between $CF_4$ and $O_2$ to remove the chrome silicide 10. The hydrogenated amorphous silicon which is the active layer 4 is hardly etched although the silicon nitride film composed of the chrome silicide 10 and the protective layer 14 is etched by an operation of making the mixed ratio of the $O_2$ gas with respect to $CF_4$ gas 1:1 or more in the plasma etching operation. The etching of the hydrogenated amorphous silicon is hardly caused although the protective layer 14 is etched by about 20 nm in the film thickness direction when one minute's plasma etching is effected at 1:3 in the ratio of, for example, $CF_4$ and $O_2$. The retreating of the pattern end face of the protective layer 14 is also progressed simultaneously together with the progress of the etching in the film thickness direction because of the trapezoidal shape in section of the protective layer 14 in the thin film transistor in Embodiment 1. The chrome silicide 10 hidden beneath the protective layer 14 is exposed, as the pattern end face of the protective layer 14 retreats, so that the chrome silicide 10 can be removed efficiently by the plasma etching with the mixed gas between $CF_4$ and $O_2$.

Figure 2B:
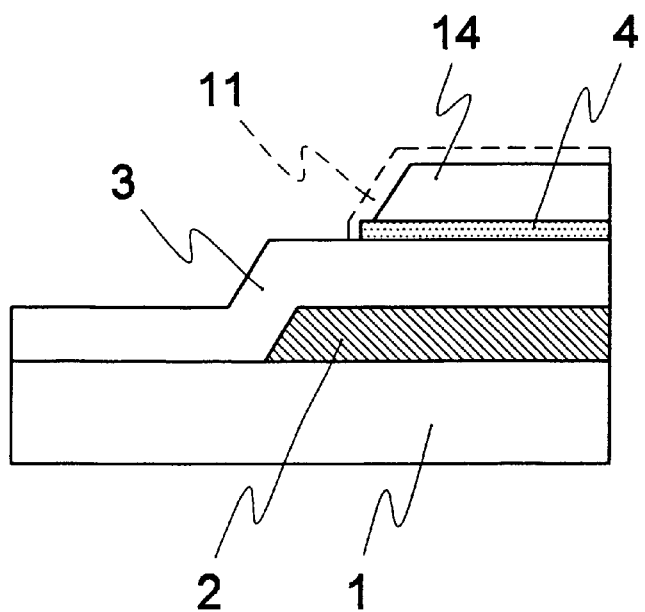

In the thin film transistor manufactured in this manner, the off current can be sufficiently lowered as shown at B in FIG. 8, because the chrome silicide 10 is completely removed as shown in FIG. 2(b).

In the thin film transistor in Embodiment 1, the pattern of the protective layer 14 can be retreated during the dry etching operation of the chrome silicide 10 because of the trapezoidal section in shape of the protective layer 14, thereby removing the chrome silicide 10 efficiently so that thin film transistor low in off current can be provided. Also, a thin film transistor without damages to the Al of the source drain currents 8 and 9 can be provided, because the chrome silicide 10 can be removed by the plasma-etching using the mixed gas between $CF_4$ and $O_2$.

Embodiment 2

Figure 3:
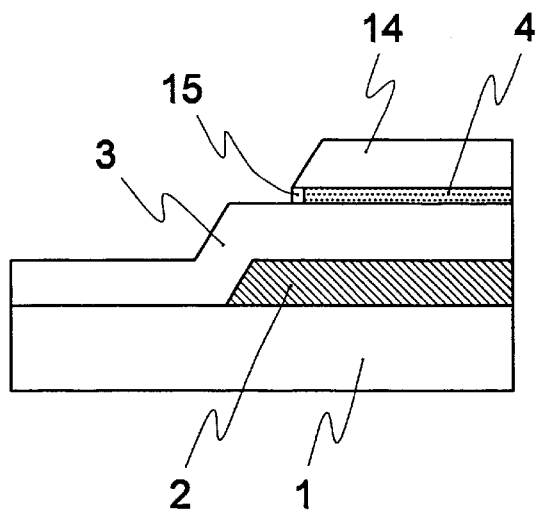
FIG. 3 is a sectional view showing thin film transistor in accordance with Embodiment 2 of the invention.

FIG. 3 is a sectional view showing a thin film transistor in Embodiment 2 of the present invention. Referring to the drawing, reference numerals 1 through 4, and 14 are those of FIG. 2. Reference numeral 15 is a film oxide formed on the end face of the active layer 4. In the thin film transistor of Embodiment 2, the manufacturing method is the same as in Embodiment 1 prior to the selective plasma etching operation of the n-type of hydrogenated amorphous silicon with respect to the silicon nitride film with furon gas (freon gas by Dupon (F123)) and the mixed gas between $SF_6$ and $O_2$ with resist and the protective layer 14 formed for patterning the source/drain regions 6 and 7 as masks.

In the thin film transistor of Embodiment 2, a film oxide 15 is formed (FIG. 3) in the active layer 4 which is a hydrogenated amorphous silicon and in the end faces of the source drain regions by plasma with $O_2$ as main component with resist being adhered immediately after it. The formation of the chrome silicide is hardly caused, because the film oxide 15 is formed on the end face of the active layer 4 although the source drain electrodes are formed as in Embodiment 1. Most of the thin film transistor manufactured in this manner shows such sufficiently low off-current as shown at B in FIG. 8. A plasma etching operation is effected with the mixed gas between $CF_4$ and $O_2$ accompanying the retreat of the pattern of the protective layer 14 as in Embodiment 1, for controlling low the off current of all the thin film transistors without fail.

The thin film transistor of which off current is low can be provided without fail. The chrome silicide is hard to form, because the sectional shape of the protective layer 14 is trapezoidal in shape and further the film oxide 15 is formed in the end face of the active layer 4. Or if the chrome silicide is formed, the pattern of the protective layer 14 can be retreated during the dry etching and the chrome silicide can be efficiently removed. Also, a thin film transistor without damages to the Al of the source drain electrodes 8 and 9 can be provided, because the chrome silicide 10 can be removed by the plasma etching using the mixed gas between $CF_4$ and $O_2$.

Embodiment 3

Figure 4:
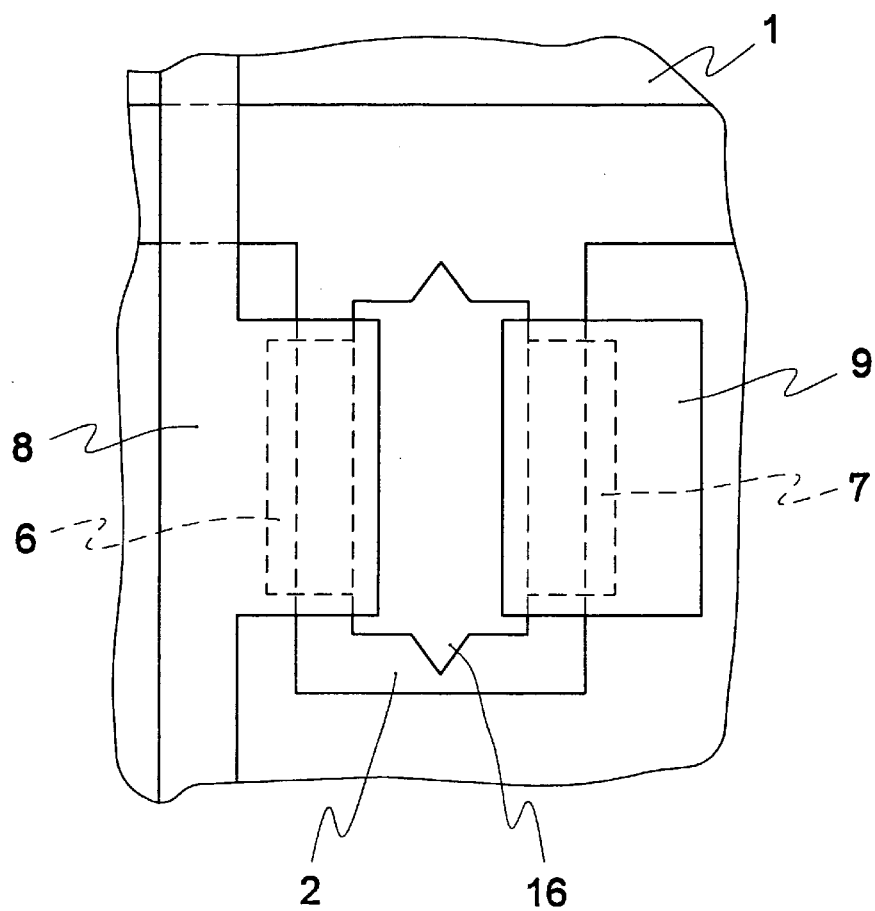
FIG. 4 is a plan view showing thin film transistor in accordance with Embodiment 3 of the invention.
Figure 5A:
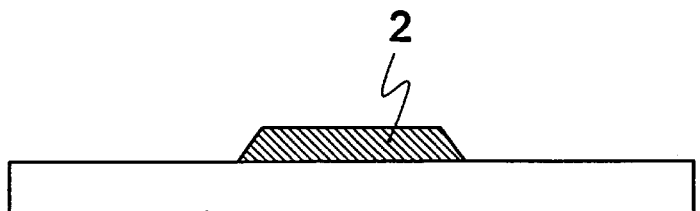
FIGS. 5(a) to 5(d) are each sectional view showing conventional transistor.
Figure 5B:
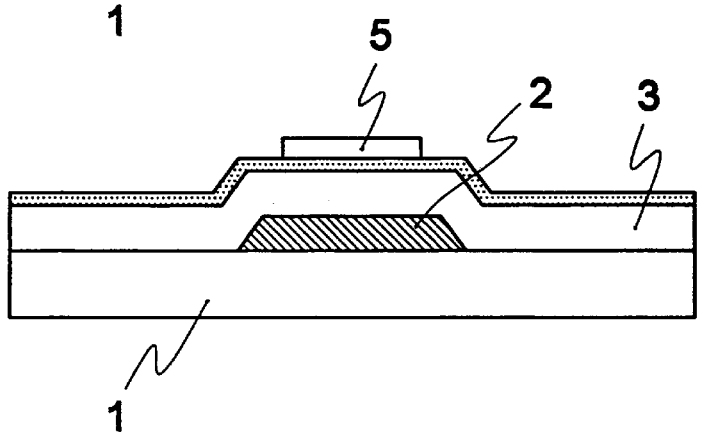
Figure 5C:
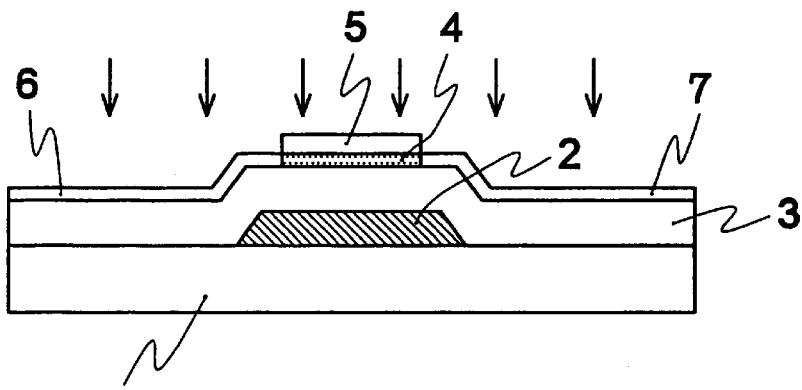
Figure 5D:
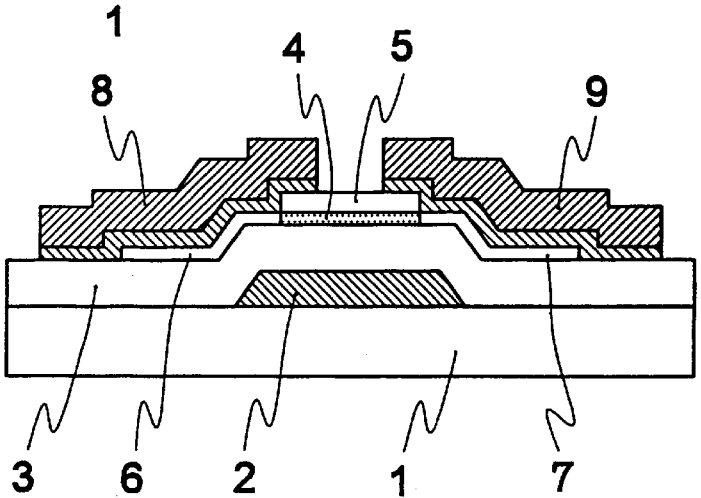

FIG. 4 is a view showing the flat face construction of a thin film transistor in Embodiment 3 of the present invention. Referring now to the drawing, reference numerals 2, and 6 through 9 are the same as those of FIG. 6 with the description thereof being omitted. Reference numeral 16 is a protective layer having a sectional trapezoid shape tapered to 80 degrees or lower with respect to the glass substrate 1 in the side face, and a pattern having convex-shaped projection between the source drain electrodes 8 and 9.

A method of manufacturing the thin film transistor of Embodiment 3 is effected as in Embodiment 1 or Embodiment 2. In the thin film transistor of Embodiment 3, the etching operation of the chrome silicide in this portion is carried out without fail, because the pattern retreating of the pattern is caused with priority in the projection portion of the convex type of the protective layer 16 when the plasma etching is effected with the mixed gas between $CF_4$ and $O_2$ accompanying the retreat of the pattern of the protective layer 16 as in Embodiment 1 and Embodiment 2. Thus, the chrome silicide for coupling the source drain electrodes 8 and 9 is cut off without fail in the projection portion of a convex shape of the protective layer 16 so that the off current of the thin film transistor with the chrome silicide being a current path can be controlled.

In the thin film transistor of Embodiment 3, a thin film transistor where the chrome silicide can be removed without fail in the projection portion and the off current is lower, because the sectional shape is of trapezoid shape and the protective layer 16 has convex type of projection between the source drain electrodes 8 and 9. Also, a thin film transistor can be provided without damages to the Al of the source drain electrode, because the chrome silicide is removed by the plasma etching using the mixed gas between the $CF_4$ and $O_2$.

The present invention has such effects as shown after, because constructed as described above.

The active layer formed to oppose the gate electrode through the gate insulating film formed on the transparent insulating substrate with gate electrode being formed on it, the source region and the drain region formed adjacent to the active layer by doping of impurities in the layer which is the same as the active layer, the protective layer formed on the active layer and having the side face inclined with respect to the transparent insulating substrate surface, the source electrode and the drain electrode formed respectively on the surface region and the drain source, and extending with its one portion being on the protective layer, are provided with the side face of the protective layer being inclined. The protective layer can be retreated at the plasma etching operation for removing the conductive layer formed in the end face of the active layer, and thus, the conducive layer which becomes a leakage current path between the source drain electrodes such as chrome silicide or the like can be removed efficiently.

Also, the protective layer, silicon nitride film, can be retreated at the plasma-etching operation.

Further, as the inclination angle is 80 degrees or lower with respect to the transparent insulating substrate surface on the side face of the protective layer, the protective layer can sufficiently be retreated at the plasma etching operation so that the conductive layer can be removed efficiently.

Also, the chrome silicide is hard to form on the end face of the active layer, because the silicon oxide film is formed on the end face not adjacent to the source region and the drain region of the active layer.

Also, the retreating of the protective layer at the plasma etching operation is caused with priority in the projection portion so that the etching of the chrome silicide in this portion can be effected without fail, because the projection portion is provided in the end portion not adjacent to the source electrode and the drain electrode of the protective layer.

Additionally, a method of manufacturing the thin film transistor of the present invention includes a first step of forming a gate electrode on the transparent insulating substrate, a second step of depositing a first insulating layer, a semiconductor layer, a second insulating layer sequentially on a transparent insulating substrate including on the gate electrode, a third step of forming a protective layer having inclined side face with respect to the transparent insulating substrate surface by plasma-etching the second insulating layer, a fourth step of ion-implanting the impurities into the transparent insulating substrate entire face with the protective layer as mask, a fifth step of forming the source region and the drain region by etching the semiconductor layer, a sixth step of forming the source electrode and the drain electrode by depositing the metal layer on its entire face, and thereafter effecting an etching operation, a seventh step of plasma-etching the entire insulating substrate with the use of gas mixed with oxygen. As the side face of the protective layer is inclined, the protective layer can be retreated at the seventh step so that the conductive layer formed on the end face of the active layer can be removed efficiently. Therefore, the thin film transistor may be made lower in off current.

Also, the chrome silicide can be efficiently removed, because fluoride carbon is mixed with the gas to be used in the plasma etching of the seventh step.

Also, an eighth step is included which forms the silicon oxide film on the end face of the amorphous silicon film with the use of the plasma including oxygen gas. The chrome silicide is hard to form on the end face of the amorphous silicon film because of the silicon oxide formed on the end face of the amorphous silicon film, because the eighth step is carried out before the sixth step after the completion of the fifth step.

Also, the chrome silicide can be removed without fail by the plasma etching, because the third step adjusts the inclination angle with respect to the transparent insulating substrate surface of the side face of the protective layer by changes in the mixed gas ratio of the oxygen gas.

Though several embodiments of the present invention are described above, it is to be understood that the present invention is not limited only to the above-mentioned, various changes and modifications may be made in the invention without departing from the spirit and scope thereof.

What is claimed is:

1. A thin film transistor comprising a transparent insulating substrate, a gate electrode formed on a portion of the transparent insulating substrate, a gate insulating film formed over the transparent insulating substrate including the portion carrying the gate electrode, a semiconductor active layer formed on the gate insulating film so as to overlie a central part of the gate electrode, a source region and a drain region formed adjacent to the semiconductor active layer, a protective layer formed on the semiconductor active layer so as to have a top surface with a source side and an oppositely directed drain side extending downwardly from the top surface and at least one further side extending downwardly from the top surface and having a different direction of orientation from either the downwardly extending source side or the downwardly extending drain side, a source electrode formed on the source region and a first part of the protective layer including a first face portion forming at least part of the downwardly extending source side of the protective layer, said downwardly extending source side extending lengthwise between two protective layer corners, a drain electrode formed on the drain region and a second part of the protective layer including a second face portion forming at least part of the downwardly extending drain side of the protective layer, said downwardly extending drain side extending lengthwise between two protective layer corners, and wherein said protective layer has at least one further face portion which is inclined with respect to a plane surface of the transparent insulating substrate and which forms at least a part of the further downwardly extending side of the protective layer that is different from either the downwardly extending source side or the downwardly extending drain side, further wherein said protective layer is plasma-etched with a use of mixed gas including sulfur fluoride and oxygen.

2. The thin film transistor of claim 1, wherein a silicide layer of an end face of the semiconductor active layer is plasma-etched with the use of mixed gas including oxygen and carbon fluoride.

3. The thin film transistor of claim 1, wherein an area of upper surface of the semiconductor active layer is equal or broader as compared with an area of bottom surface of the protective layer.

4. A thin film transistor comprising a transparent insulating substrate, a gate electrode formed on a portion of the transparent insulating substrate, a gate insulating film formed over the transparent insulating substrate including the portion carrying the gate electrode, a semiconductor active layer formed on the gate insulating film so as to overlie a central part of the gate electrode, a source region and a drain region formed adjacent to the semiconductor active layer, a protective layer formed on the semiconductor active layer so as to have a top surface with a source side and an oppositely directed drain side extending downwardly from the top surface and at least one further side extending downwardly from the top surface and having a different direction of orientation from either the downwardly extending source side or the downwardly extending drain side, a source electrode formed on the source region and a first part of the protective layer including a first face portion forming at least part of the downwardly extending source side of the protective layer, said downwardly extending source side extending lengthwise between two protective layer corners, a drain electrode formed on the drain region and a second part of the protective layer including a second face portion forming at least part of the downwardly extending drain side of the protective layer, said downwardly extending drain side extending lengthwise between two protective layer corners, and wherein said protective layer has at least one further face portion which is inclined with respect to a plane surface of the transparent insulating substrate and which forms at least a part of the further downwardly extending side of the protective layer that is different from either the downwardly extending source side or the downwardly extending drain side, further wherein at least an end face portion of said semiconductor active layer adjacent to the at least one further face portion is free of a silicide layer formed from silicon and source, drain electrode material.

5. The thin film transistor of claim 4, wherein said source, drain electrode material comprises chrome.

6. The thin film transistor of claim 5, wherein said silicide layer is eliminated by plasma-etching with a use of mixed gas including oxygen and carbon fluoride.

7. The thin film transistor of claim 4, wherein said silicide layer is eliminated by plasma-etching with a use of mixed gas including oxygen and carbon fluoride.

8. The thin film transistor of claim 7, wherein said mixed gas is oxygen dominant.

9. The thin film transistor of claim 6, wherein said mixed gas is oxygen dominant.

10. A thin film transistor comprising a transparent insulating substrate, a gate electrode formed on a portion of the transparent insulating substrate, a gate insulating film formed over the transparent insulating substrate including the portion carrying the gate electrode, a semiconductor active layer formed on the gate insulating film so as to overlie a central part of the gate electrode, a source region and a drain region formed adjacent to the semiconductor active layer, a protective layer formed on the semiconductor active layer, a source electrode formed on the source region and a first part of the protective layer including a first end face of the protective layer, a drain electrode formed on the drain region and a second part of the protective layer including a second end face of the protective layer, and wherein said protective layer has a surrounding side face which is inclined with respect to a plane surface of the transparent insulating substrate at least in side face portions forming protective layer end faces other than the first end face or the second end face, further wherein the surrounding side face includes opposite facing end segments that are remote from the first or second part, said end segments each having a convex-shaped projection along each of said end segments.

\* \* \* \* \*